(12) United States Patent
Penney

(10) Patent No.: US 6,381,183 B1
(45) Date of Patent: Apr. 30, 2002

(54) COLUMN REDUNDANCY FOR PREFETCH

(75) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/875,181

(22) Filed: Jun. 7, 2001

Related U.S. Application Data

(63) Continuation of application No. 09/642,775, filed on Aug. 22, 2000.

(51) Int. Cl.[7] ............................................. G11C 29/00
(52) U.S. Cl. .................................. 365/200; 365/189.08
(58) Field of Search ................................. 365/200, 201, 365/225.7, 189.08, 189.07

(56) References Cited

U.S. PATENT DOCUMENTS

| | | | |
|---|---|---|---|
| 4,344,155 A | * 8/1982 | Mollier | 365/200 |
| 4,520,453 A | * 5/1985 | Chow | 365/200 |
| 4,841,498 A | * 6/1989 | Sugimura | 365/200 |
| 5,281,868 A | 1/1994 | Morgan | 326/10 |
| 5,574,689 A | 11/1996 | Morgan | 365/200 |
| 5,684,746 A | * 11/1997 | Oowaki et al. | 365/200 |
| 5,745,429 A | 4/1998 | Cowles et al. | 365/230.08 |
| 5,835,446 A | 11/1998 | Park | 365/233 |
| 6,055,194 A | 4/2000 | Seo et al. | 365/194 |

* cited by examiner

*Primary Examiner*—Tan T. Nguyen
(74) *Attorney, Agent, or Firm*—Dickstein Shapiro Morin & Oshinsky LLP

(57) ABSTRACT

An integrated memory circuit is provided having at least one subtractor coupled to each redundant fuse set for subtracting a predetermined value from a known redundant address value, thereby calculating a comparison value. Once the comparison value is calculated, it is forwarded to a redundant compare circuit where it is compared to the address of a primary circuit element specified by the user. If a match is found, the primary circuit element sought to be accessed is bypassed and a redundant circuit element is activated to carry out the desired operation.

13 Claims, 6 Drawing Sheets

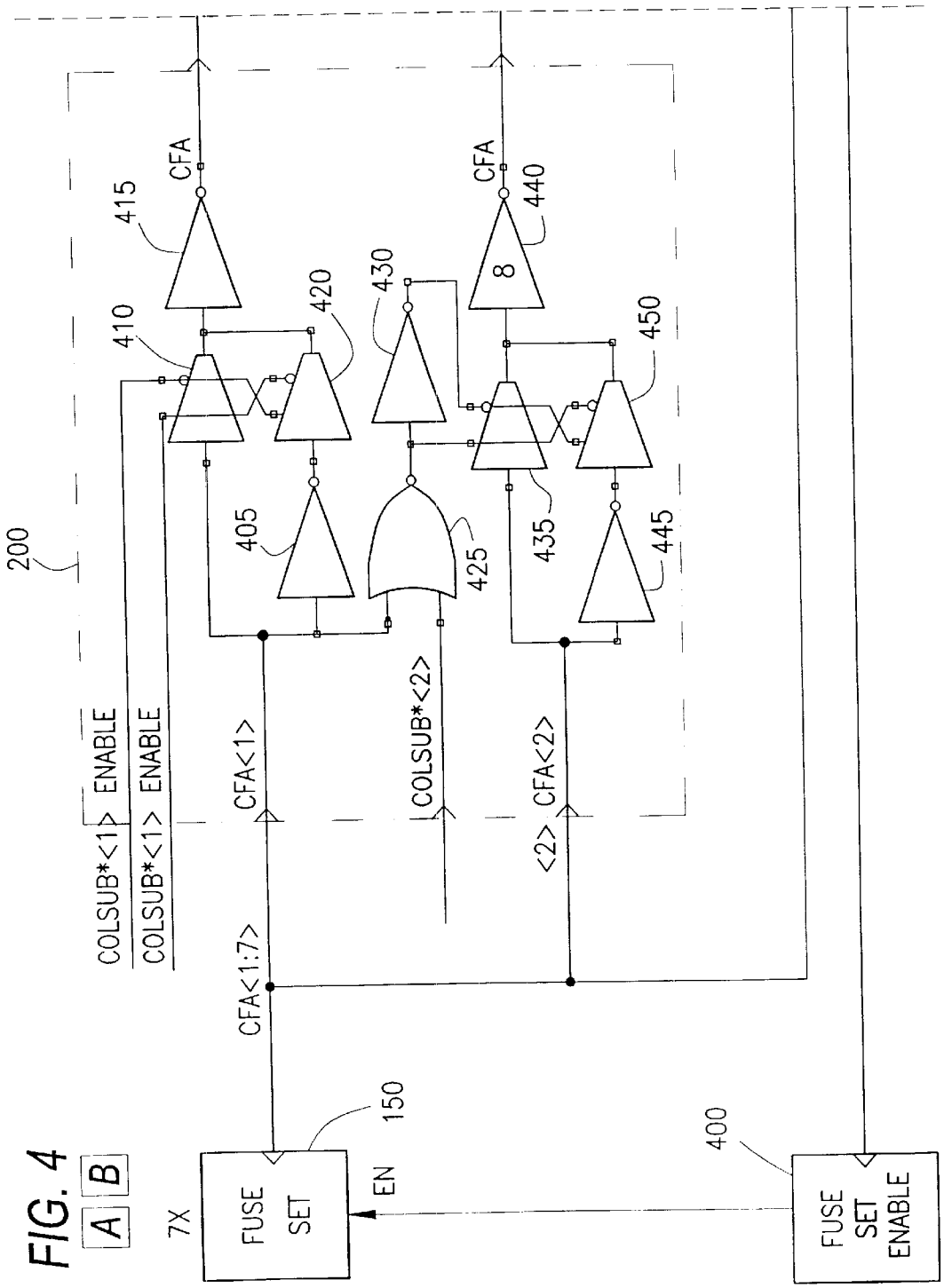

COLUMN REDUNDANCY FOR PREFETCH

This application is a continuation of application Ser. No. 09/642,775, filed Aug. 22, 2000, the entire contents of which are incorporated herein by reference.

BACKGROUND OF THE INVENTION

1. Field of the Invention

The present invention relates to the field of integrated circuits. More particularly, it relates to a column redundancy system for use with a dynamic random access memory (DRAM) operating in a prefetch mode.

2. Description of the Related Art

Technological advances have permitted semiconductor integrated circuits to fit significantly more circuit elements in a given silicon area. Reducing and eliminating defects in the circuit elements has, however, become increasingly more difficult with the increased density of circuit elements. To achieve higher population capacities, circuit designers strive to reduce the size of the individual circuit elements to maximize available die real estate. The reduced size makes these circuit elements increasingly susceptible to defects caused by material impurities during fabrication. Nevertheless, the defects are identifiable upon completion of the integrated circuit fabrication by testing procedures, either at the semiconductor chip level or after packaging.

Scrapping or discarding defective integrated circuits when defects are identified is economically undesirable, particularly if only a small number of circuit elements are actually defective. In addition, relying on zero defects in the fabrication of integrated circuits is an unrealistic option. Therefore, redundant circuit elements are provided on integrated circuits to reduce the number of scrapped integrated circuits. If a primary circuit element is determined to be defective, a redundant circuit element is substituted for the defective primary circuit element. Substantial reductions in scrap are achieved by using redundant circuit elements without substantially increasing the cost of the integrated circuit.

One type of integrated circuit device that uses redundant circuit elements is integrated memory circuits, such as dynamic random access memories (DRAMs), static random access memories (SRAMs), video random access memories (VRAMs), and erasable programmable read only memories (EPROMs). Typical integrated memory circuits comprise millions of equivalent memory cells arranged in arrays of addressable rows and columns. The rows and columns of memory cells are the primary circuit elements of the integrated memory circuit. By providing redundant circuit elements, either as rows or columns, defective primary rows or columns can be replaced.

Because the individual primary circuit elements (rows or columns) of an integrated memory circuit are separately addressable, replacing a defective circuit element typically comprises blowing fuse-type circuits to "program" a redundant circuit element to respond to the address of the defective primary circuit element. This process is very effective for permanently replacing defective primary circuit elements.

In the case of DRAMs, for example, a particular memory cell is selected by first providing a unique row address corresponding to the row in which the particular memory cell is located and subsequently providing a unique column address corresponding to the column in which the particular memory cell is located. When the address of the defective primary circuit element is presented by the user, redundancy circuitry must recognize the address and reroute all signals to the redundant circuit element.

During testing of the DRAM at the factory, defective primary circuit elements are identified and a suitable redundant circuit element is selected. The fuses corresponding to the redundant circuit are blown in a predetermined order to represent the address of the defective primary circuit element to be replaced. During each memory access, each address provided to the DRAM by the user is compared to the corresponding fuses to determine if a redundant match is present. Whenever a redundant match is detected, the primary circuit element is bypassed and the redundant circuit element is activated to perform the required function. Various techniques and redundant compare circuits are known in the art to facilitate the address/fuse compare operation. Exemplary compare schemes are described in U.S. Pat. No. 5,574,689 to Morgan, the entire content of which is incorporated herein by reference.

When an integrated memory circuit (e.g., a DRAM as described above) is operated in a prefetch mode, it simultaneously accesses multiple columns (i.e., multiple addresses) in a given clock cycle or series of clock cycles. For example, when a DRAM is operated in a 2-bit prefetch mode, it simultaneously access two columns (i.e., 2 addresses), thereby fetching two bits of data for every address specified by the user rather than one. That is, the user supplies a first address, and the second address is calculated internally by the DRAM. For each clock cycle (or series of clock cycles), the DRAM simultaneously accesses the first address (supplied by the user) and a second address (calculated by the DRAM). Of course, it should be understood that prefetch modes may be configured to simultaneously fetch more than two addresses. For example, a 4-bit prefetch will fetch four addresses at a time and an 8-bit prefetch will fetch eight addresses at a time, and so on. For purposes of simplicity, however, only the 2-bit prefetch will be described in connection with the invention.

The calculation of the second (or some greater number) address is conventionally carried out with an adder in the redundancy compare path of the column address path. Referring to FIG. 1, a primary circuit element address (e.g., a starting column address) is input by the user and is forwarded to a latch 100 for temporary storage. The primary circuit element address (e.g., column address) is then forwarded to a first redundancy compare circuit 120 over communication link 160, where it is compared with the addresses of redundant circuit elements located in the fuse sets 150 (e.g., as determined by the pre-blown fuses). If a match is detected between the user supplied address of the primary circuit element and an address of a redundant circuit element within the fuse sets 150, then a "Redundancy Enable" signal goes, e.g., logic HIGH and the primary circuit element (e.g., column) sought to be accessed is bypassed while the redundant circuit element (e.g., redundant column) is activated to perform the desired function (e.g., a memory access).

Simultaneously with the activation, the address is forwarded to an adder 110 over communication link 170, where a second address is calculated by the DRAM. The second address may be, e.g., an address adjacent to the starting column address. Assuming, for exemplary purposes, the user specified an address having a value of "1." In order for the DRAM to access a second (adjacent) address, the adder 110 adds "1" to the value of the specified address, thereby calculating the second address (e.g., value "2"). After the adder 110 has calculated the second address (e.g., value "2")

it must be compared with the fuse sets 150 to determine if the second address ("2") matches a redundant address. To accomplish this, the second address is forwarded to a second redundant compare circuit 130 and is compared with the redundant addresses in the fuse sets 150 as described above.

One problem associated with the FIG. 1 configuration is that during the prefetch operation, the adder 110 is required to calculate the second address. Since the adder is located in what is known as the "speed path" (i.e., the column address path), and since the adder 110 requires time to calculate the second address, which is then forwarded to redundancy compare circuit 130, the entire memory access operation is slowed down.

The problem is exacerbated for prefetch operations of greater values (e.g., 4-bit, 8-bit, etc.) since more than one adder 110, 140, 160 must be used to calculate the multiple addresses, which are then forwarded to respective redundancy compare circuits 130, 170, 180 (e.g., for 4-bit prefetch). The addition operations increase the time required to perform the memory access, thereby greatly reducing the benefit of operating under a prefetch mode. Thus, there exists a desire and need for a redundancy system that may be used with an integrated memory circuit operating under prefetch mode that does not prolong memory access time.

SUMMARY OF THE INVENTION

The present invention overcomes the problems associated with the prior art and provides a system and method for comparing a specified address with redundant addresses programmed within fuse sets during a prefetch mode of operation. The present invention achieves the above without prolonging the memory access time. In accordance with an exemplary embodiment of the invention, an integrated memory circuit is provided with at least one subtractor coupled to each redundant fuse set. Each subtractor subtracts a predetermined value from a known redundant address value (i.e., the redundant address programmed within the fuse set) to calculate a comparison value. Once the comparison value is calculated, it is forwarded to a redundant compare circuit, where it is compared with the address of a primary circuit element specified by the user. If a match is found, the primary circuit element sought to be accessed is bypassed and a redundant circuit element is activated to carry out the desired operation (e.g., a memory access).

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in exemplary embodiments illustrated in FIGS. 2–5. Other embodiments may be utilized and structural or logical changes may be made to the disclosed embodiments without departing from the spirit or scope of the present invention.

Figure 1:
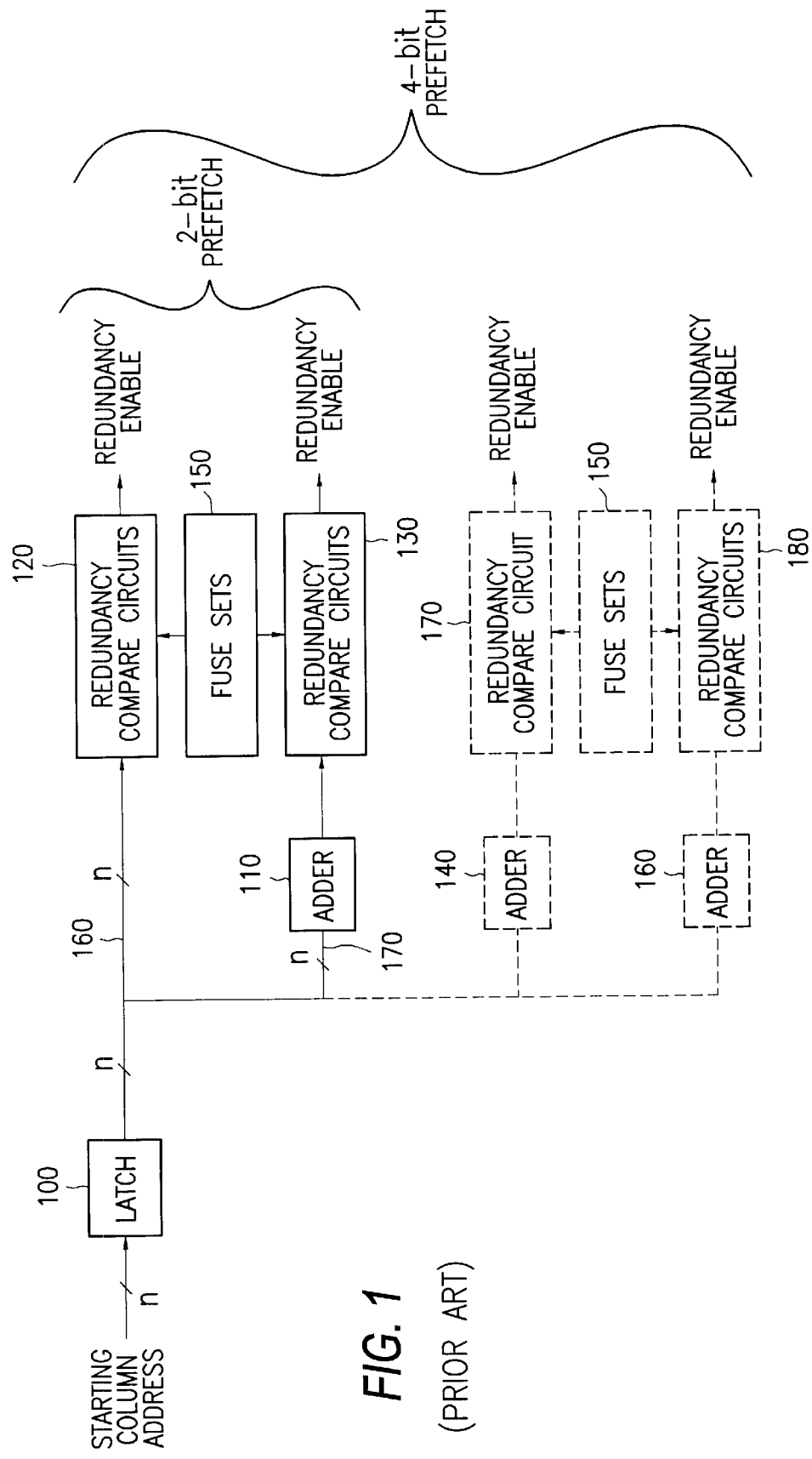
FIG. 1 illustrates a block diagram of a conventional redundancy system.
Figure 2:
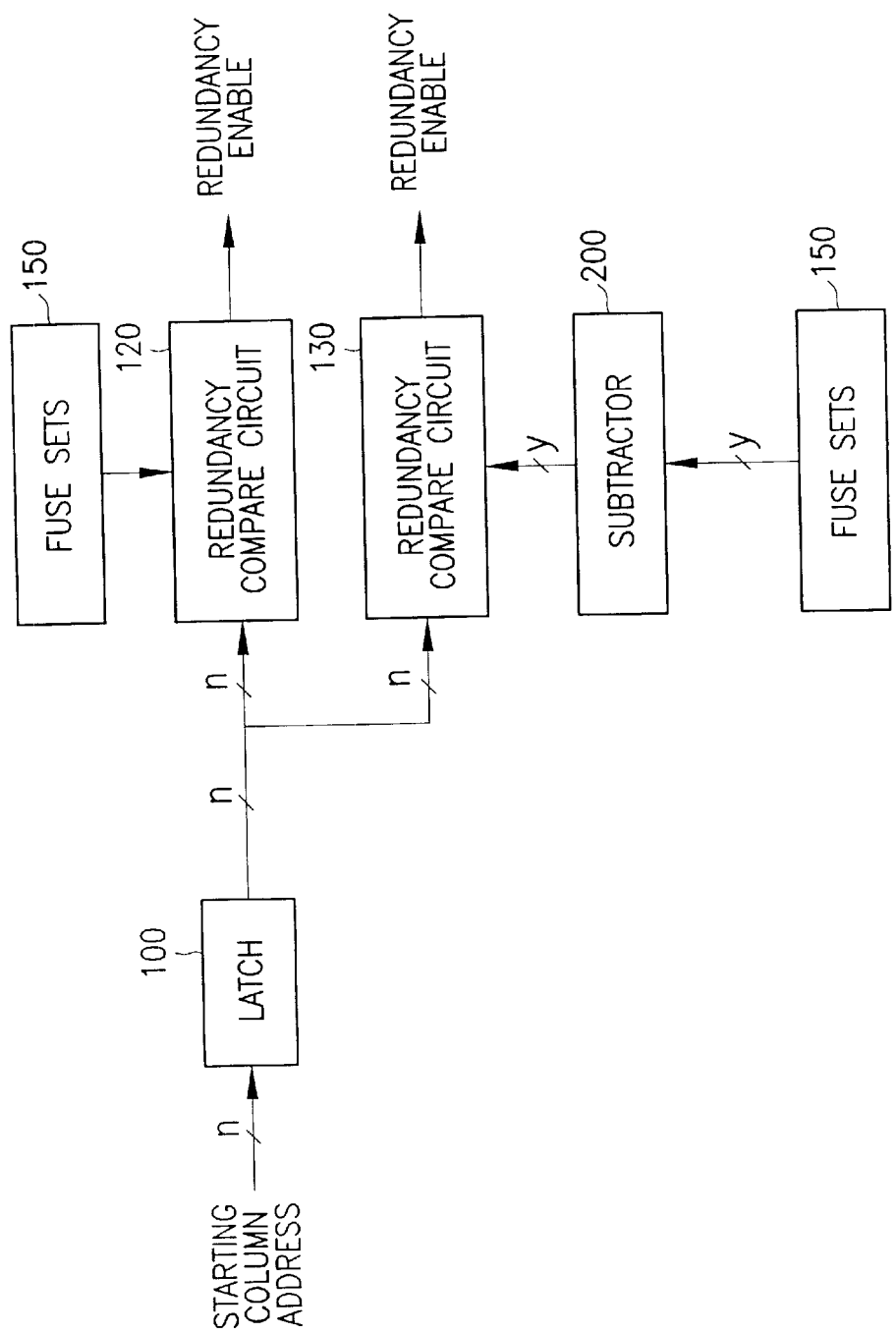
FIG. 2 Illustrates a block diagram of a redundancy system in accordance with an exemplary embodiment of the invention.

FIG. 2 illustrates a block diagram of a redundancy system constructed in accordance with an exemplary embodiment of the invention. Similar to the system of FIG. 1, an address of n-bits of a primary circuit element (e.g., a starting column address) is entered by a user as illustrated at a left side of the diagram. The starting column address is fed into and temporarily stored in a latch 100. The starting column address is then simultaneously fed into two redundancy compare circuits 120 and 130. The first redundancy compare circuit 120 receives address information for the redundant circuit elements (e.g., redundant columns) of fuse sets 150 and compares them to the starting column address entered by the user.

The second redundancy compare circuit 130 receives address information for the redundant circuit elements front fuse sets 150 that has been passed through a subtractor 200. That is, after passing through subtractor 200, the redundant address information from the fuse sets 150 is forwarded to the second redundancy compare circuit 130, where the resulting address information is compared to the starting column address. Upon detecting a match in either one of redundancy compare circuits 120, 130, a "Redundancy Enable" signal goes, e.g., logic HIGH and the column sought to be accessed is bypassed while the redundant column is activated to carry out the desired operation (e.g., a memory access). It should be readily understood that the "Redundancy Enable" signal may go logic LOW upon detecting a match which would then signal a bypass of the column sought to be accessed in favor of the redundant column.

During operation, for example, if a starting column address having a value of "1" is received, it is simultaneously forwarded to both redundancy compare circuits 120, 130. Redundancy compare circuit 120 compares the starting column address (e.g., "1") with the values of the redundant addresses of the fuse sets 150. If a match is found, the "Redundancy Enable" signal goes, e.g., logic HIGH as described above.

Simultaneously, redundancy compare circuit 130 compares the starting column address to a comparison address generated by subtractor 200. That is, the redundant addresses within the fuse sets 150 are subjected to a subtraction operation via subtractor 200 whereby each respective address value of the redundant circuit elements (e.g., redundant columns) within the fuse sets 150 is reduced by a predetermined value to produce another comparison value to be compared with the starting column address.

For example, assuming that address location "2" is defective and is stored as a redundant address within fuse set 150, and subtractor 200 subtracts a predetermined value (e.g., "1"), then a value of "2" minus "1" (or "1") is forwarded to the second redundancy compare circuit 130. When the starting column address equals "1," a match is not found in the first redundancy compare circuit 120 because fuse set 150 is forwarding a "2" (i.e., the redundant column address) and therefore its "Redundancy Enable" signal is, e.g., logic LOW. However, a match is found within the second redundancy compare circuit 130 because the subtractor 200 subtracts a value of "1" from the address values of the fuse sets 150 (e.g., "2"), which are compared with the starting column address ("1"); therefore, the "Redundancy Enable" signal of the second redundancy compare circuit 130 goes, e.g., logic HIGH on the output of redundancy compare circuit 130.

The FIG. 2 configuration assumes 2-bit prefetch operation. That is, when the user specifies a first address (i.e., the starting column address), the integrated memory circuit (e.g., DRAM) calculates a second address to be accessed simultaneously with the first address. Rather than calculating that second address by adding a predetermined value to the starting column address specified by the user, the redundancy system of the invention starts with the known redundant address values of the fuse sets 150 and subtracts a predetermined value from those respective addresses in order to determine whether a match exists between those addresses and the starting column address.

Figure 3:
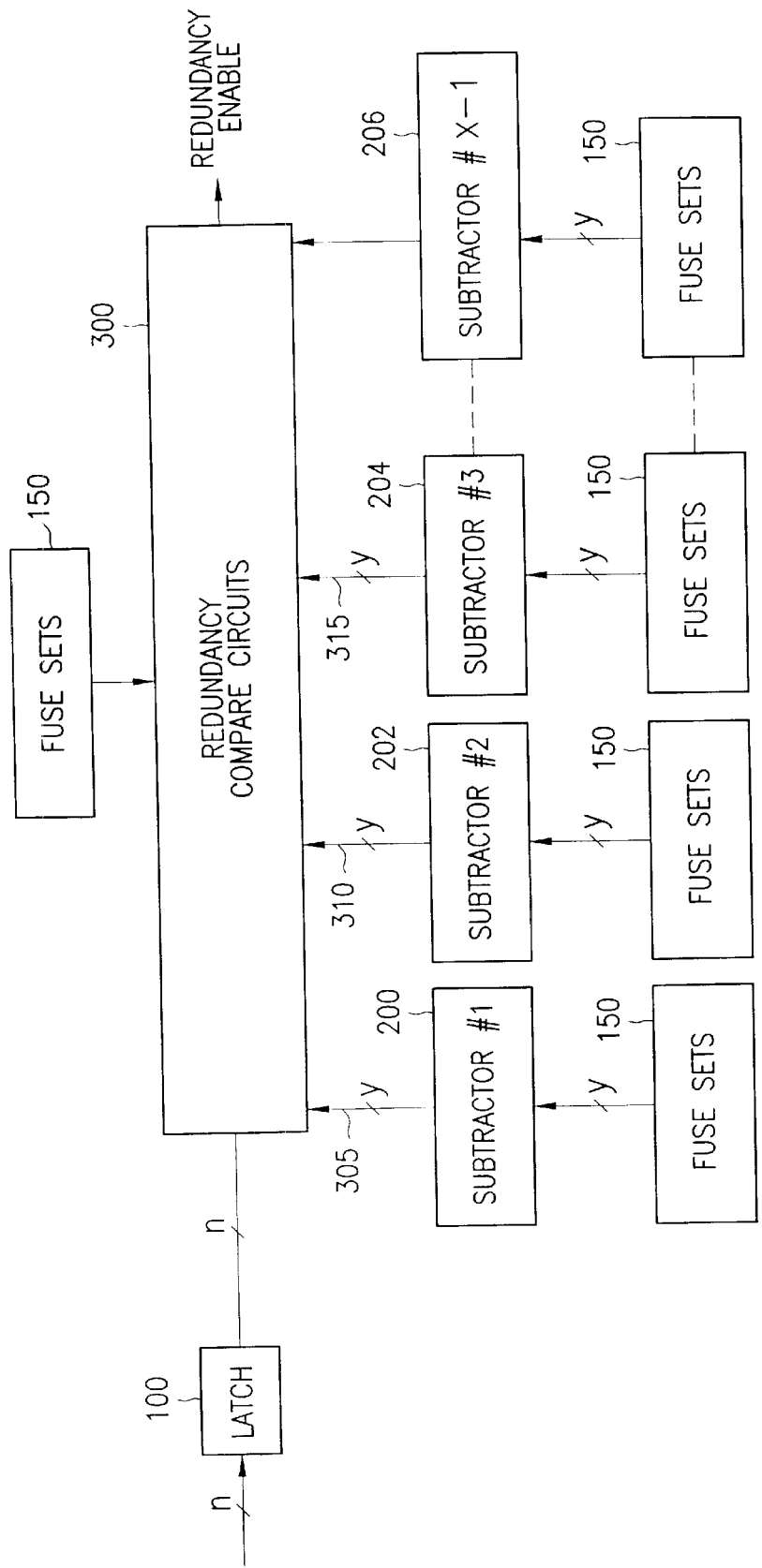
FIG. 3 illustrates a block diagram of a redundancy system in accordance with another exemplary embodiment of the invention.

Turning now to FIG. 3, another block diagram of a redundancy system in accordance with an exemplary embodiment of the invention is depicted. Similar to the system of FIG. 2, the FIG. 3 system contains a latch 100 for temporarily storing a starting column address received from a user. The starting column address is then forwarded to redundancy compare circuits 300. The redundancy compare circuits 300 contain a plurality of redundancy compare circuits such as those depicted in FIG. 2 (circuits 120 and 130). The FIG. 3 system depicts a plurality of subtractor circuits 200, 202, 204, 206. When a 4-bit prefetch mode is used, then subtractors 1–3 (i.e., 200, 202, 204) are employed.

For example, if fuse set 150 contains one redundant column address of value "4," and each subtractor 200–204 is configured to subtract a respective predetermined value from the redundant column address value, then three separate and distinct comparison values are fed into redundancy compare circuits 300 via communication links 305, 310 and 315 for comparison with the starting column address supplied by the user. Assuming, in accordance with a 4-bit prefetch operation, the first subtractor 200 is configured to subtract a value of "1," the second subtractor 202 is configured to subtract a value of "2," and the third subtractor 204 is configured to subtract a value of "3," then on respective communication links 305, 310 and 315 respective comparison values of "3," "2" and "1" are fed into redundancy compare circuits 300. Similarly, fuse set 150 feeds in a value of "4" from a top side of redundancy compare circuits 300. Therefore, when a starting column address of value "1" is entered by the user and forwarded to redundancy compare circuits 300, only one match will be found, that being a match with a comparison value ("1") received by the third subtractor 204. Therefore, while the user has supplied a single address, three other addresses are simultaneously accessed, and one redundant address is discovered. The user supplied address and the addresses represented by the comparison values of "3" and "2" will be accessed as intended; however, the address represented by the comparison value of "1" will not be accessed as intended but will instead be replaced with a redundant address from the fuse sets 150. That is, the user has specified a first address and the DRAM has generated three additional addresses (i.e., of respective values "3," "2" and "1").

As depicted in FIG. 3, prefetch modes of greater than "2" and "4" may be used. For example, 8-bit prefetch, 16-bit prefetch and so on may be used. However, a total of X–1 subtractors are employed in the invention, where X is the number of bits simultaneously fetched minus 1. Subtractor X–1 is designated with numeral 206 in FIG. 3.

Figure 4B:
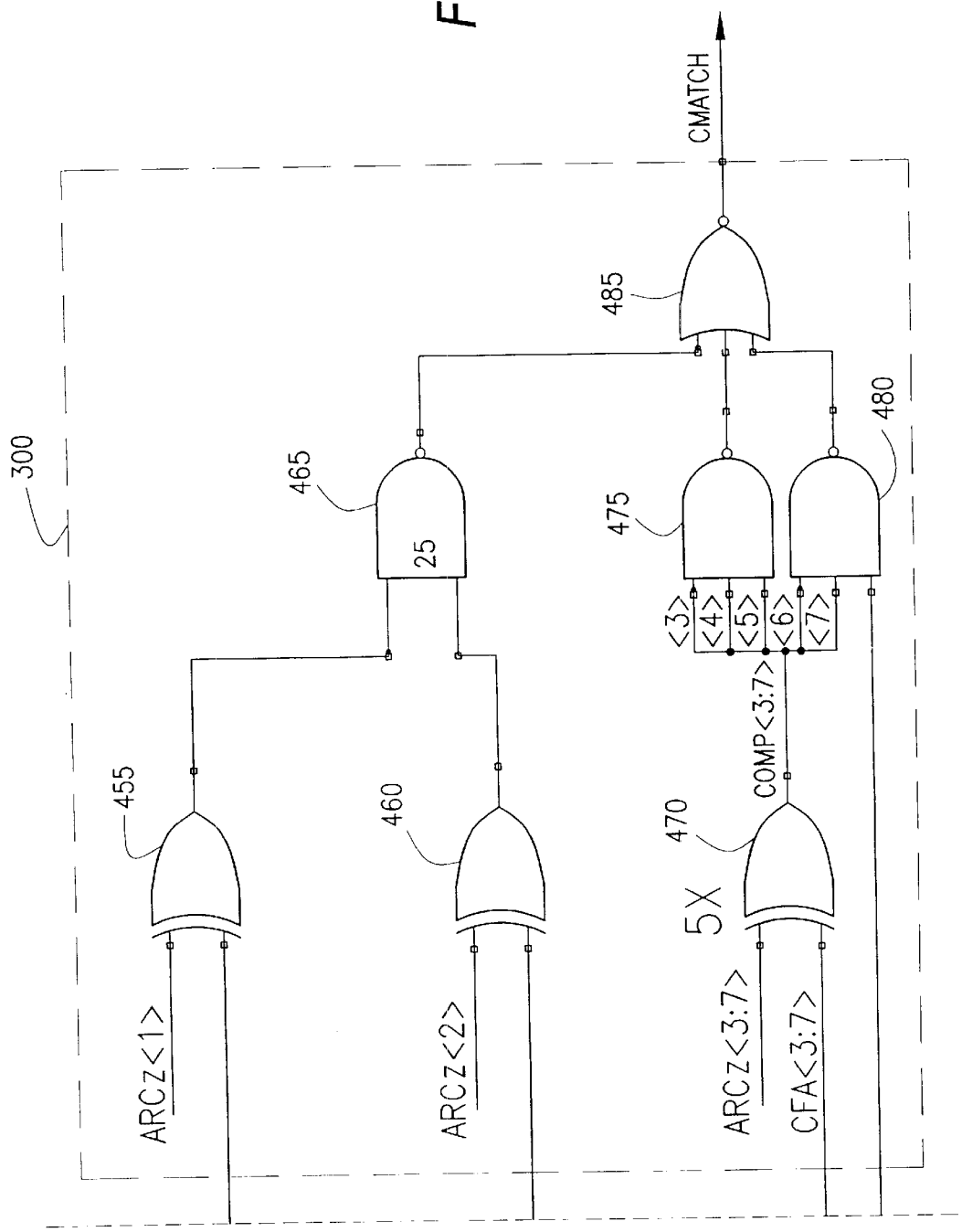
FIG. 4 illustrates an exemplary schematic diagram of the FIG. 2 redundancy system.

Turning now to FIG. 4, an exemplary schematic diagram of the FIG. 2 redundancy system is depicted. Fuse sets 150 are depicted in the top left portion of FIG. 4. As illustrated by the "7X," there are seven fuses that make up one fuse set 150 in the present embodiment of the invention. That is, there are seven bits in the redundant column address with one fuse for each bit. For simplicity purposes, only one such fuse set 150 is shown in FIG. 4. The two least significant bits LSB (i.e., CFA<2>, CFA<1>) of 7-bit fuse column address CFA<1:7> are fed into subtractor 200. CFA<1> is fed into multiplexer (MUX) 410 and inverter 405 whose output is coupled to an input of MUX 420. MUX 420 is coupled to an input of inverter 415. The enable signals for MUXs 410, 420 are ColSub<1> and ColSub*<1>. The enable signals alternate such that only one of the MUXs 410, 420 is enabled at a time. The output of inverter 415 is coupled to an input of Exclusive OR gate (XOR) 455. In addition, one bit of the starting column address ARCz<1> is fed into another input of XOR gate 455. The output of XOR gate 455 is fed into NAND) gate 465.

CFA<1> is also fed into an input of NOR gate 425. ColSub*<2> is fed into a second input of NOR gate 425. An output of NOR gate 425 is input into inverter 430. The output of NOR gate 425 is also forwarded to MUX 435 and MUX 450. The output of inverter 430 is forwarded to MUX 435 and MUX 450 as well. CFA<2> is fed into inverter 445. The output of inverter 445 is fed into MUX 450. An output of MUX 450 is coupled to an input of inverter 440.

An output of inverter 440 is coupled to an input of XOR gate 460. A second input of XOR gate 460 receives one bit of the starting column address ARCz<2>. An output of XOR gate 460 is fed into NAND gate 465.

Fuse set enable circuit 400 enables the fuse set 150 and is also fed into NAND gate 480 at the lower right-hand portion of FIG. 4 to enable the compare circuit 300. CFA<3:7> (i.e., the five most significant bits (MSB) of the column address) are each fed into a respective XOR gate 470. That is, there are five XOR gates 470 (i.e., one for each MSB of the CFA). A second input of each XOR gate 470 receives a respective corresponding MSB from the ARCz (i.e., the column address). Respective outputs of the five XOR gates 470 are fed into NAND gates 475 and 480. As depicted in FIG. 4, the comparison values for bits 3 through 5 are fed into NAND gate 475 and the comparison values for bits 6 and 7 are fed into NAND gate 480. The respective outputs of NAND gates 475 and 480 are fed into NOR gate 485. The output CMATCH of NOR gate 485, when logic HIGH, causes a selected redundant column to fire instead of the normal column.

Still referring to FIG. 4, although the illustrated embodiment shows the two LSBs as being fed into subtractor 200, the number of bits in the fuse address that are forwarded to the subtractor is not critical in practicing the invention. In addition, although only two LSBs are forwarded to the subtractor 200, all seven bits of the fuse column address CFA<1:7> are compared with the seven bits of the starting column address ARCz<1:7>. The two LSBs are forwarded to subtractor 200 and compared with respective bits of the column address ARCz[1:2], and the remaining bits of the fuse column address are compared with the column address with XOR gates 470, NAND gates 475, 480 and NOR gate 485.

While the subtraction operation can be implemented in different ways, the FIG. 4 embodiment accomplishes the subtraction by toggling the LSB (CFA<1>). Furthermore, CFA<2> is toggled if the LSB, CFA<1>, was a value of, e.g., logic LOW. Control signals ColSub*<1:2> are used to control the subtraction of either both bits, just the LSB, or neither bit (e.g., depending upon the burst lengths of the address) and are not critical for practicing the invention. That is, the way in which the subtraction of bits is controlled is not critical for practicing the invention.

For example, a fuse column address having its two LSBs of "11" (i.e., binary 3) input to subtractor 200 will yield an output of "10" (binary 2). That is, the subtractor 200 subtracted a value of "1" from the input column fuse address CFA<1:2>. As described above, the LSB is toggled (i.e., "1" is toggled to "0") in order to implement the subtraction operation. If, for example, the LSBs were respectively "1" and "0" (i.e., binary 2), then the LSB is toggled (i.e., from "0" to "1"), and since the LSB was logic LOW the second bit is also toggled (i.e., from "1" to "0") for a result of "01" (or binary 1).

During operation, for example, if bit 1 of CFA, CFA<1>, is logic "0" and bit 2 of CFA, CFA<2>, is logic "1," then a value of logic "1" is received at the output of inverter 415 and a value of logic "0" is received at the output of inverter 440 (i.e., at the output of subtractor 200). That is, when the LSB of the column fuse address CFA<1> is "0," and multiplexer 410 is enabled, CFA<1> is forwarded to inverter 415 where it is toggled to a logic "1." As described above, when the LSB is logic "0," the second LSB, CFA<2> is also toggled. This is carried out with NOR gate 425. When the output of NOR gate 425 is logic "0," the output of inverter 430 is logic "1" which enables multiplexer 435. When CFA<2> is logic "1," it is forwarded to inverter 440 via multiplexer 435 where the "1" is toggled to a logic value "0."

Figure 5:
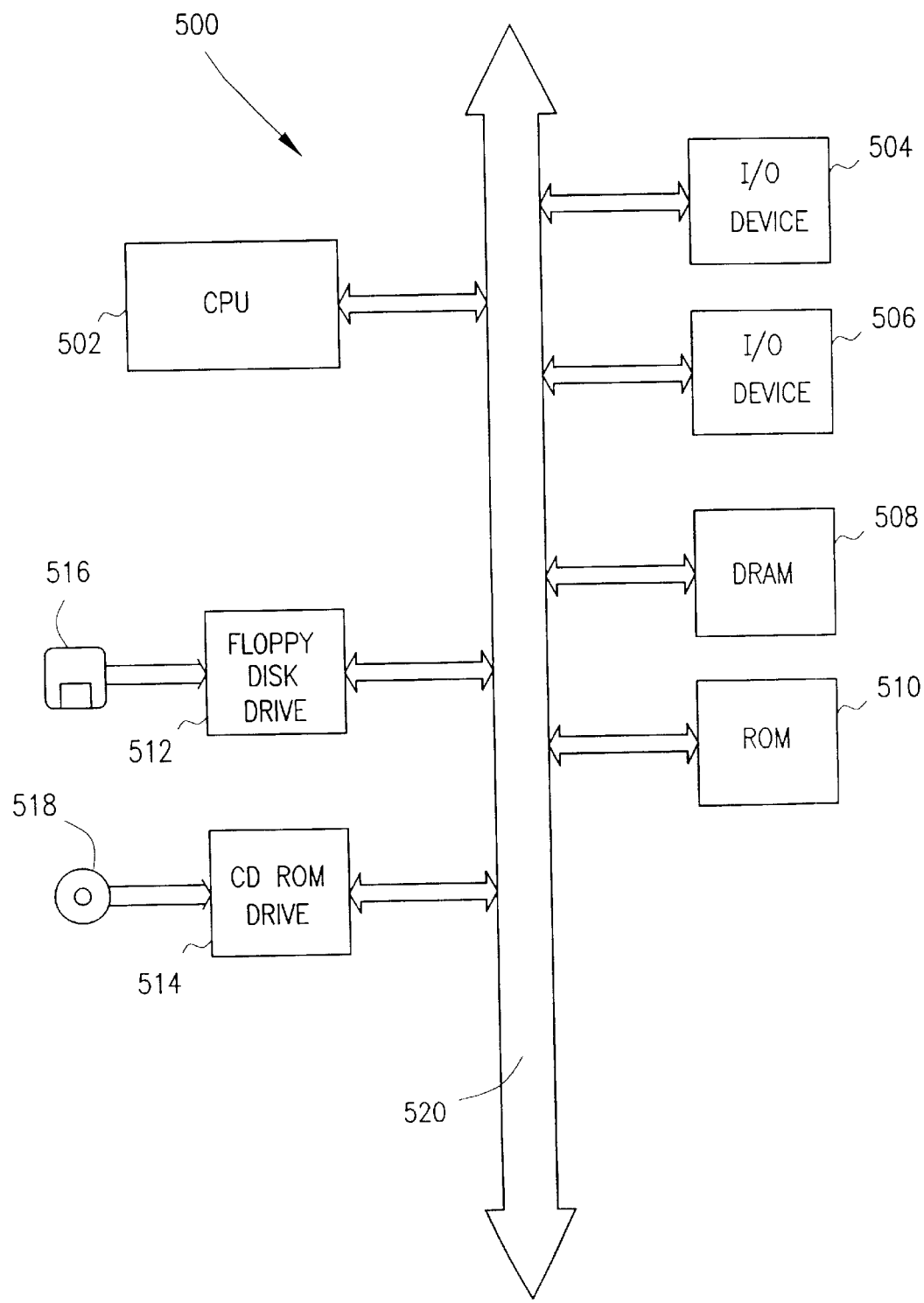
FIG. 5 illustrates a block diagram of a processor-based system incorporating a DRAM having a redundancy system in accordance with an embodiment of the invention.

FIG. 5 illustrates a block diagram of a processor based system 500 that incorporates an integrated memory circuit (e.g., DRAM 508) having a subtractor 200 (as described in connection with FIGS. 2 through 4) in accordance with the present invention. The processor based system 500 may be a computer system or any other system having an integrated memory device containing a subtractor such as that described above. The system 500 includes a central processing unit (CPU) 502, e.g., a microprocessor that communicates with DRAM 508 over communication bus 520. The CPU 502 communicates with a memory (e.g., ROM 510, floppy disk 516, compact disk 518, etc.) over bus 520. It must be noted that the bus 520 may be a series of busses and bridges commonly used in a processor based system but, for convenience purposes only, the bus 520 has been illustrated as a single bus. Input/output (I/O) devices 504, 506 are also connected to the bus 520 if required. Processor based system 500 may also include peripheral devices such as a floppy disk drive 512 (for reading floppy disk 516) and a compact disk (CD) ROM drive 514 (for reading CD 518). These peripheral devices 512, 514 also communicate with the CPU 502 over the bus 520 as is well known in the art.

The present invention provides an integrated memory device (e.g., a DRAM) containing at least one subtractor, which is coupled to at least one fuse set. For 2-bit prefetch, one subtractor is used, for 4-bit prefetch, three subtractors are used, and so on. The redundant column addresses of the fuse sets are entered into the subtractors where they are modified in accordance with a predetermined set of instructions (e.g., the subtractor subtracts a value of "1" from each redundant column address). The resulting value is then compared with the starting column address specified by the user. If a match is found, the redundant column is activated to replace the starting column address. The invention may include any number of subtractors and any number of fuse sets or redundant column addresses.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although FIGS. 2 and 3 depict the invention as using a starting address latch 100, it should be readily understood that the column address could be provided directly from the device inputs without latching; or from a counter, which is also commonly used to provide the column address for some number of cycles after the starting address. Accordingly, the invention is not to be seen as limited by the foregoing description, but is only limited by the scope of the appended claims.

What is claimed as new and desired to be protected by Letters Patent of the United States is:

1. A method for controlling an integrated memory circuit, the method comprising:
   changing a first address corresponding to a redundant circuit element by a predetermined value to arrive at a second address; and
   comparing said second address with a third address corresponding to a primary circuit element and, if a match exists, activating said redundant circuit element associated with said first address.

2. The method of claim 1, wherein said act of changing comprises subtracting a predetermined value from said first address to arrive at a comparison value.

3. The method of claim 2, wherein said act of comparing comprises comparing the comparison value with said third address corresponding to a primary circuit element and, if a match is found, activating the redundant circuit element.

4. The method of claim 3 further comprising receiving said third address corresponding to a primary circuit element at said integrated memory circuit.

5. The method of claim 3 further comprising comparing said third address corresponding to a primary circuit element with said first address corresponding to a redundant circuit element and, if a match exists, activating the redundant circuit element.

6. A system for controlling an integrated memory circuit, the system comprising:
   a first compare circuit for comparing a first address corresponding to a primary circuit element and a second address; and
   a modifier coupled to said first compare circuit for forwarding said second address to said first compare circuit, said second address being a result of said modifier modifying a third address corresponding to a redundant circuit element by a predetermined value.

7. The system of claim 6, wherein said modifier comprises a subtractor for subtracting a predetermined value from said third address corresponding to a redundant circuit element for forming said second address.

8. The system of claim 6 further comprising a second compare circuit for comparing said first address corresponding to a primary circuit element with said third address corresponding to a redundant circuit element.

9. A memory circuit comprising, a redundancy control system, the system comprising:
   a first compare circuit for comparing a first address corresponding to a primary circuit element and a second address; and
   a modifier coupled to said first compare circuit for forwarding said second address to said first compare circuit, said second address being a result of said modifier modifying a third address corresponding to a redundant circuit element by a predetermined value.

10. The memory circuit of claim 9, wherein said modifier comprises a subtractor for subtracting a predetermined value from said third address corresponding to a redundant circuit element for forming said second address.

11. The memory circuit of claim 10 further comprising a second compare circuit for comparing said first address corresponding to a primary circuit element with said third address corresponding to a redundant circuit element.

12. A processor system comprising:

a processor; and a memory circuit coupled to said processor, said memory circuit comprising:

a first compare circuit for comparing a first address corresponding to a primary circuit element and a second address; and a modifier coupled to said first compare circuit for forwarding said second address to said first compare circuit, said second address being a result of said modifier modifying a third address corresponding to a redundant circuit element by a predetermined value.

13. The processor system of claim 12 further comprising a second compare circuit for comparing said first address corresponding to a primary circuit element with said third address corresponding to a redundant circuit element.

* * * * *